US009522450B2

(12) United States Patent
Berthier et al.

(10) Patent No.: US 9,522,450 B2
(45) Date of Patent: Dec. 20, 2016

(54) SUPPORT FOR CAPILLARY SELF-ASSEMBLY WITH HORIZONTAL STABILISATION, FABRICATION METHOD AND USE

(71) Applicants: COMMISSARIAT A L'ENERGIE ATOMIQUE ET AUX ENE ALT, Paris (FR); STMICROELECTRONICS (CROLLES 2) SAS, Crolles (FR)

(72) Inventors: Jean Berthier, Meylan (FR); Lea Di Cioccio, Saint Ismier (FR); Sebastien Mermoz, Meylan (FR)

(73) Assignees: Commissariat a' l'energie atomique et aux energies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 291 days.

(21) Appl. No.: 14/221,402

(22) Filed: Mar. 21, 2014

(65) Prior Publication Data
US 2014/0283367 A1    Sep. 25, 2014

(30) Foreign Application Priority Data
Mar. 25, 2013 (FR) ..................... 13 52657

(51) Int. Cl.
*B23Q 3/02* (2006.01)
*H01L 23/498* (2006.01)
*H01L 25/00* (2006.01)

(52) U.S. Cl.
CPC ........... *B23Q 3/02* (2013.01); *H01L 23/49838* (2013.01); *H01L 25/50* (2013.01);
(Continued)

(58) Field of Classification Search
CPC ...... B23Q 3/02; H01L 25/50; H01L 23/49838; H01L 2924/0002; H01L 2224/26175; Y10T 29/49982; Y10T 29/53091; Y10T 29/53178; Y10T 29/49998
See application file for complete search history.

(56) References Cited

U.S. PATENT DOCUMENTS 9,240,389 B2 *   1/2016   Di Cioccio et al. .. H01L 23/147

FOREIGN PATENT DOCUMENTS

JP          2005-317694        11/2005
WO     WO 2011/132630 A1     10/2011

OTHER PUBLICATIONS

U.S. Appl. No. 14/354,402, filed Apr. 25, 2014, Sabbione, et al.
(Continued)

*Primary Examiner* — John C Hong
(74) *Attorney, Agent, or Firm* — Oblon, McClelland, Maier & Neustadt, L.L.P.

(57) ABSTRACT

A support is provided, including a reception zone in which the external envelope matches the shape of a plate configured to be placed on a droplet deposited at least in the reception zone in order to achieve capillary self-assembly of the plate and the support, and at least one pair of tracks that extend on the support from the reception zone and that have a lyophilic-type affinity with the droplet such that an overflow of the droplet beyond the reception zone is guided in the tracks, wherein the at least one pair of tracks includes a first track and a second track that do not have the same lyophilic-type degree of affinity with the droplet.

14 Claims, 4 Drawing Sheets

(52) U.S. Cl.
CPC ............... *H01L 2224/26175* (2013.01); *H01L 2924/0002* (2013.01); *Y10T 29/49982* (2015.01); *Y10T 29/49998* (2015.01); *Y10T 29/53091* (2015.01); *Y10T 29/53178* (2015.01)

(56) References Cited

OTHER PUBLICATIONS

Takafumi Fukushima, et al., "Development of a new self-assembled die bonder to three-dimensionally stack known good dies in batch", IEEE, 2009, 4 Pages.

French Preliminary Search Report issued Aug. 6, 2013 in French Application 13 52657, filed on Mar. 25, 2013 ( with English Translation of Categories of Cited Documents).

Takafumi Fukushima et al. "Self-Assembly of Chip-Size Components with Cavity Structures: High-Precision Alignment and Direct Bonding without Thermal Compression for Hetero Integration", Micromachines, ISSN 2072-666X, 2011, 20 pages.

J Berthier et al. "Self-alignment of silicon chips on wafers: A capillary approach", Journal of Applied Physics 108, 2010, 10 pages.

U.S. Appl. No. 14/504,701, filed Oct. 2, 2014, Di Cioccio, et al.
U.S. Appl. No. 14/773,215, filed Sep. 4. 2015, Pouteau, et al.

\* cited by examiner

SUPPORT FOR CAPILLARY SELF-ASSEMBLY WITH HORIZONTAL STABILISATION, FABRICATION METHOD AND USE

TECHNICAL DOMAIN

The domain of the invention relates to the creation of structures by capillary self-assembly of mesoscopic structures. The main applications of this technique are 3D microelectronics (for which an attempt is made to vertically stack and then bond electronic chips), optics (particularly alignment of light emitting diodes or micro-mirrors) and finally packaging of MicroElectroMechanical Systems (MEMS) or fluidic microsystems (for which an attempt is made to precisely position a cover plate so as to bond it onto the system).

STATE OF PRIOR ART

The capillary self-assembly technique for mesoscopic sized objects is based on the use of capillary forces to displace an object into a predefined alignment. According to this technique, a mobile arbitrary shaped plate (or chip or patch) is placed on a liquid droplet previously deposited on a fixed support with a corresponding shape. The mobile plate is aligned precisely above the support by capillary forces created by anchorage of the liquid onto the edges of the mobile plate and the support. The envelope of the floating mobile plate is then the exact image of the envelope of the support, translated vertically upwards.

If the liquid is water, evaporation results in the contact of the plate with the support, which bond together by direct contact. This is the case for 3D microelectronics, packaging of MEMS or labs-on-chip.

If the liquid is a chemical substance that solidifies, the plate is fixed in a well-controlled location. This is the case particularly for optical applications.

A fairly good alignment success rate can be achieved if some precautions are taken, for example such as good wetting of the two facets (plate and support) with control of its anchorage on edges, nevertheless, for industrialisation, this success rate must achieve very high levels.

Studies (for example see the article by J. Berthier et al. entitled <<Self-alignment of silicon chips on wafers: A capillary approach", J. Appl. Phys. 108, 054905, 2010) have shown that movement of the plate on the liquid film can be broken down into four modes, namely lateral translation (shift), rotation about the vertical axis (twist), vertical translation (lift) and tilt about the horizontal axis (tilt). It has been determined that all these modes are stable, in other words they align the chip, except for the tilt that is slightly unstable. In other words, the mobile plate can tilt slightly and progressively on the drop until it comes into contact with the support.

These studies have been confirmed by experimental observations. For 3D microelectronics, it has been observed that tilt can cause mechanical contact between the plate (chip) and the support, blocking the plate alignment movement. Concerning applications in the optical field in which the intermediate liquid solidifies progressively, tilt causes bad horizontal alignment of the plate that deteriorates the optical quality.

Taking account of plate displacement modes is essential: there is always an initial alignment fault when the plate is deposited on the drop, composed of a shift, a twist, a lift and an initial tilt. The capillary self-assembly method is based on resorption of these initial defects. But the fact that the tilt is unstable, even if only slightly, creates a problem that has to be solved.

Other causes of bad alignment apart from tilt have been observed: an unexpected overflow of liquid that prevents anchorage of the fluid on the edges, a plate wetting fault, and possibly a dynamic phenomenon related to deposition of the chip. And until now, no industrially developable solution has been put forward to solve the alignment problem related to the tilt except to improve the horizontality of the plate at the time of deposition on the drop.

PRESENTATION OF THE INVENTION

The purpose of the invention is to improve the alignment of the plate and the support and to achieve this, it discloses a support comprising a reception zone in which the external envelope matches the shape of a plate designed to be placed on a droplet placed at least in the reception zone in order to achieve capillary self-assembly of the plate and the support, and at least one pair of tracks that extend on the support from the reception zone and that have a lyophilic type affinity with the droplet such that an overflow of the droplet beyond the reception zone is guided in the tracks, characterised in that the at least one pair of tracks comprises a first track and a second track that do not have the same lyophilic type degree of affinity with the droplet.

The fact that uncontrolled overflow leads to bad alignment has led to the wrong idea that all types of overflow are harmful. This is why teams working on this problem have adopted the principle of attempting to prevent any overflow. The approach recommended in the invention is quite different; at least one lyophilic track is formed to induce a controlled overflow that can control the tilt, while maintaining the effects that lead to alignment.

Furthermore, the use of tracks that do not have the same lyophilic type degree of affinity with the droplet makes it possible to confer a given inclination from the horizontal (in other words tilt) onto the plate.

The following describes preferred but non-limitative aspects of this support:
- at least one pair of tracks and at least part of the reception zone have a lyophilic type of affinity with the droplet;
- the first track and the second track extend on each side of the reception zone prolonging each other along a single direction;
- it comprises at least two pairs of tracks extending in the support plane, for example along approximately perpendicular directions;
- it comprises a plurality of contiguous patterns, in which each pattern is delimited by a periphery inside which the external envelope of a reception zone is circumscribed, the at least one pair of tracks extending from the reception zone as far as the periphery of the pattern;
- the first and the second tracks do not have the same width;
- the first and the second tracks are made from different materials;
- it comprises an electro-capillary device associated with each track so that the lyophilic type degree of affinity with the droplet can be modified.

The invention also relates to a capillary method for self-assembly of a plate on a support according to the first aspect of the invention, comprising steps to place at least one droplet in the support reception zone, and to place the plate on the droplet. The support may have a plurality of patterns, in which each pattern is delimited by a periphery inside which the external envelope of a reception zone is circumscribed, at least one pair of tracks extending from the reception zone as far as the periphery of the pattern, and the method comprises global wetting of the support to place a droplet in each reception zone. Furthermore, the method can comprise collective placement of a plurality of plates.

The invention also includes a method to form a support comprising a reception zone in which the external envelope matches the shape of a plate that will be placed on a droplet deposited in the reception zone with the objective of capillary self-assembly of the plate and the support, characterised in that it comprises the formation of at least one pair of tracks extending on the support from the reception zone and with a lyophilic type affinity with the droplet such that any overflow of the droplet outside the reception zone is guided in the tracks, the at least one pair of tracks comprising a first track and a second track that do not have the same lyophilic type degree of affinity with the droplet.

This method may also include the formation of the first track and the second track such that they extend on each side of the reception zone prolonging each other, said first and second tracks not being subjected to the same surface treatment in order to confer a different lyophilic type degree of affinity with the droplet for each.

BRIEF DESCRIPTION OF THE DRAWINGS

Other aspects, purposes, advantages and characteristics of the invention will become clear after reading the following detailed description of preferred embodiments of the invention given as non-limitative examples with reference to the appended drawings on which:

FIG. 3c shows resorption of an initial tilt movement of a plate deposited on the support in FIG. 1a;

DETAILED PRESENTATION OF PARTICULAR EMBODIMENTS

According to a first aspect, and with reference to FIGS. 1a-1b, 2a-2b and 3a-3c, the invention relates to a support comprising a reception zone Z1, Z2 in which the external envelope matches the shape of a plate P1, P2 that will be placed on a droplet G deposited at least in the reception zone for capillary self-assembly of the plate and the support.

Figure 1A:
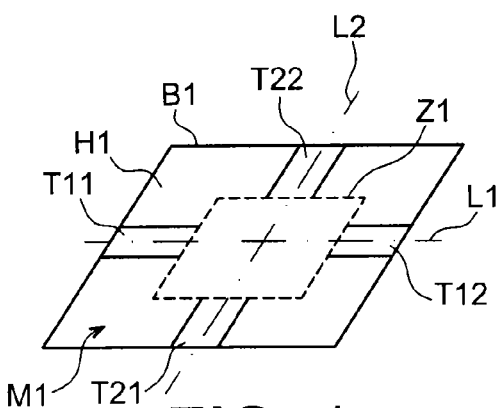
FIGS. 1a and 1b diagrammatically show supports according to different possible embodiments of the invention.
Figure 1B:
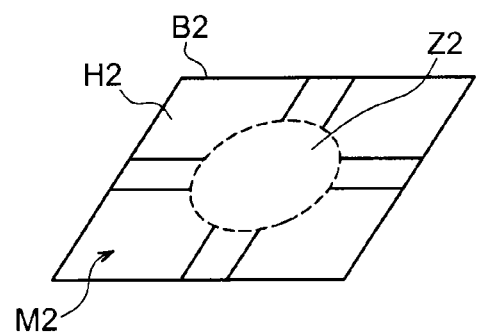
Figure 2A:
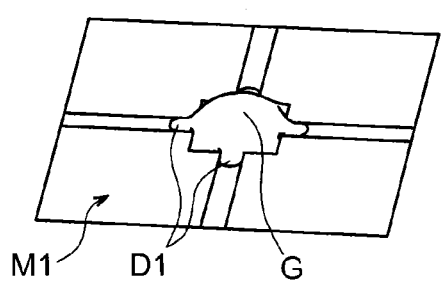
FIGS. 2a and 2b show supports in FIGS. 1a and 1b respectively on which a droplet has been deposited.
Figure 2B:
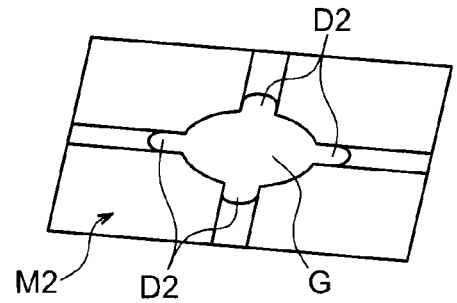
Figure 3A:
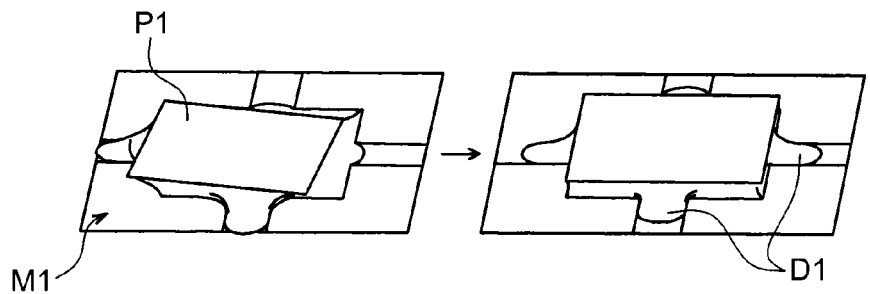
FIGS. 3a and 3b show capillary self-alignment of a plate deposited on the supports in FIGS. 1a and 1b respectively.
Figure 3B:
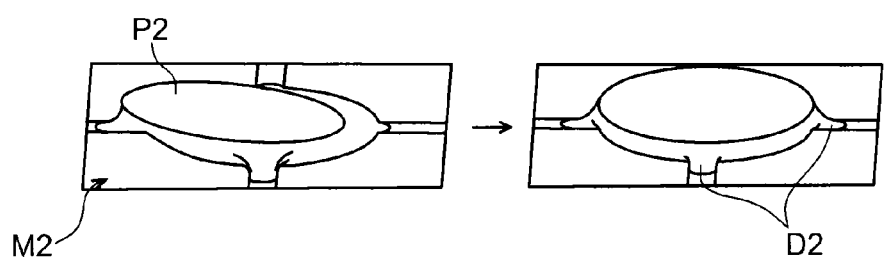

In a purely illustrative example, plate P1 may for example be in the shape of a square, such that the external envelope of the reception zone Z1 is also square (FIGS. 1a, 2a and 3a). In another example, plate P2 is circular, and the external envelope of the reception zone Z2 is therefore also circular (FIGS. 1b, 2b and 3b).

In the figures, the shape of the reception zone Z1, Z2 is the same as the shape of the plate P1, P2. The invention is not limited to this case, and it also relates to more complex shaped objects such as plates in which one or several cavities are formed in the free face and corresponding supports in which the reception zone comprises one or several assembly zones on which the free face of the plate will be aligned, the assembly zones for example being in the form of plateaus projecting beyond the surface of a substrate, the cavity(ies) facing the surface of the substrate and at a distance from it. For example, such a complex shape is described in the article by Fukushima T. et al. entitled "Self-Assembly of Chip-Size Components with Cavity Structures: High-Precision Alignment and Direct Bonding without Thermal Compression for Hetero Integration", Micromachines. 2011; 2 (1):49-68.

Zones of the plate and the support that will be assembled by capillarity are lyophilic, in the sense that they have an affinity with the liquid in the droplet. These zones are thus hydrophilic when the liquid is aqueous. The reception zone of the support thus has at least one lyophilic region (the assembly region(s)), the entire reception zone being lyophilic in the case of the simple shapes shown in the figures.

In the framework of the invention, an auxiliary structure is provided in the support, outside the reception zone Z1, Z2 the external envelope of which corresponds to the shape of the plate. More precisely, the support comprises at least one pair of tracks T11, T12, T21, T22 extending on the support from the reception zone Z1, Z2.

The tracks have a lyophilic type affinity with the droplet such that an overflow of the droplet outside the reception zone Z1, Z2 is guided in the tracks. The result is that a controlled overflow is induced so that the tilt can be controlled, while maintaining the effects that cause alignment.

The presence of the tracks defines a geometric pattern M1, M2 on the support. The pattern M1, M2 is delimited by a periphery B1, B2 inside which the external envelope of the reception zone Z1, Z2 is circumscribed, the tracks T11, T12, T21, T22 extending from the reception zone Z1, Z2 as far as the periphery of the pattern. In the examples described in the figures above, the pattern M1, M2 is a square with a side larger than the characteristic dimension (side in the case of a square, diameter in the case of a circle) of the reception zone Z1, Z2.

The at least one pair of tracks T11, T12, T21, T22 and at least part of the reception zone Z1, Z2 are lyophilic, while the remainder of the pattern (in other words the outside of the reception zone except for the at least one pair of tracks and, when the reception zone is not entirely lyophilic, the non-lyophilic part of the reception zone) is lyophobic. An important contrast in wettability between the lyophilic parts and the lyophobic parts can give a high success rate of the alignment. In the framework of the invention, this large contrast is guaranteed provided that there is a difference of more than 40° and preferably more than 50° between the contact angle at which the droplet is deposited on the lyophilic zones and the contact angle at which the droplet is deposited on the lyophobic zones. The contact angle on the lyophilic regions is typically less than 60°, while the contact angle on the lyophobic regions is typically more than 100°, and preferably more than 110°.

As can be seen in the figures, the lyophilic tracks may be straight tracks. It would also be possible for the tracks in one pair (T11 and T12; T21 and T22) to be associated along the same direction (L1; L2) prolonging each other respectively on each side of the reception zone.

As shown, it would also be possible to provide two pairs of straight tracks T11, T12; T21, T22 per pattern that extend along independent directions L1; L2 in the plane of the support to control the tilt along two directions. In particular, the two pairs of tracks can extend along directions that intersect at the centre of the reception zone, for example along the diagonals of the pattern or along rectangular directions as shown in the figures.

The tracks extend from the reception zone as far as the edge of the pattern along a length of a track. The width of a track is advantageously between ⅙ and ¼ of the characteristic dimension of the plate (diameter for a circular plate, side from which the track portion starts for a polygonal object). Thus, the track is neither too wide (which could result in alignment forces and couples of other modes, namely shift and twist, being too weak to align the plate and the support) nor too narrow (in which case the liquid could not advance along the track). If it is required that the overflow of the droplet guided in one track remains circumscribed in the pattern without reaching the edge of the pattern, the length of the track should be more than three times the width of the track, typically between 3 and 4 times the width of the track.

Figure 3C:
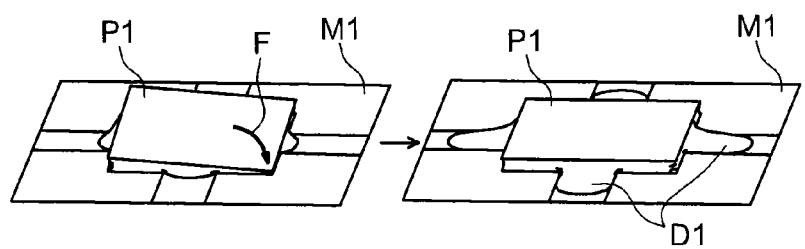

FIGS. 2a-2b show the formation of liquid <<fingers>> D1, D2 on the lyophilic tracks following deposition of a liquid droplet G. As can be seen in FIGS. 3a-3b showing the capillary realignment of a plate P1, P2 after its deposition on the droplet, the liquid <<fingers>> D1, D2 act as guys that stabilise the plate horizontally, due to the capillary force that they apply. And as can be seen in FIG. 3c, a tilt movement of the plate (shown by an arrow F at the left of this figure) is resorbed due to the presence of the tracks.

According to the invention, the plate is forced into a given inclination from the horizontal (in other words a tilt). To achieve this, and with reference to FIG. 4a, one track T11 of a pair of tracks and the other track T12 of the pair of tracks do not have the same lyophilic type degree of affinity with the droplet. The contrast in wettability between the tracks in the pair may for example result in a tilt of about 2° when the contact angle is 5° on one track T11 of the pair while the contact angle is 40° on the other track T12 of the pair.

Figure 4A:
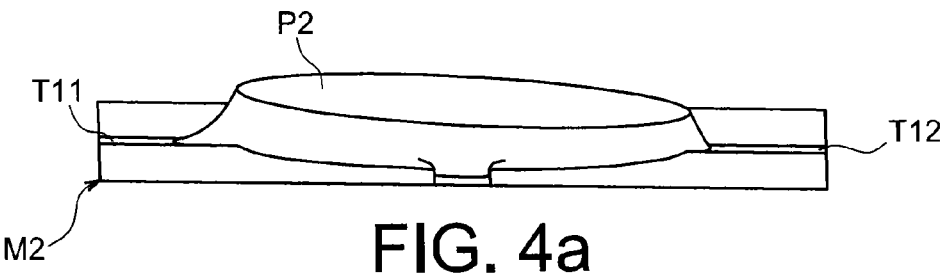
FIGS. 4a and 4b are diagrams showing tilt control according to the invention.

The example in FIG. 4a shows an inclination to the right from an axis perpendicular to the direction L1 of the pair of tracks T11, T12. Obviously, the invention is not limited to the case in which a wettability contrast is given to the tracks in a single pair, but it includes the case in which such a contrast is also given to one or several other pairs of tracks. As a result, the axis about which the inclination is made can be modified.

According to a first variant, the wettability contrast is achieved by assuring that tracks T11 and T12 in a pair of tracks extending along the same direction do not have the same width.

According to a second variant, the wettability contrast is achieved by using different materials for tracks T11 and T12 in the pair. For example, one of the tracks may be made from silicon while the other track is made from nitride.

According to a third variant, the wettability contrast is achieved by applying a different surface treatment to the tracks T11 and T12 in the pair to confer a lyophilic type affinity with the droplet on them, or to accentuate their existing affinity. For example, one of the tracks may be subjected to a plasma treatment which accentuates the lyophilic nature, while the other is not.

Figure 4B:
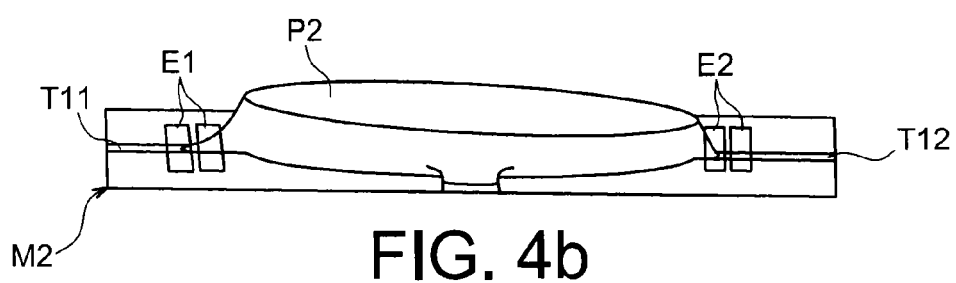

According to a fourth variant shown in FIG. 4b, an electro-capillary device is associated with each of the tracks T11, T12 in a pair of tracks so as to be able to modify the lyophilic type degree of affinity with the droplet. The electro-capillary device may be in the form of a pair of electrodes E1, E2 arranged under the surface of the support to enable application of a voltage between the droplet and each track, the modification of the applied voltage modifying the contact angle of the droplet on the corresponding track.

Achieving such a plate inclination is particularly interesting in the optofluidics domain in which it is often required to make micro-mirrors. According to the variants mentioned above, gelling of the liquid then leads to a tilted fixed mirror. According to the fourth variant, a tilting mirror can be made provided that the liquid does not solidify nor evaporate like an organic liquid, as is the case for example for a silicone oil. A tilted/tilting LED can also be made in the same way.

According to one embodiment of the invention, the support has a plurality of patterns as described above, the patterns typically being arranged in rows and columns. This embodiment makes it possible to collectively place a plurality of plates on the support, in the same way as described for example in the article by Fukushima T. and al. entitled "Development of a new self-assembled die bonder to three-dimensionally stack known good dies in batch", 3DIC, page 1-4. IEEE, (2009).

Figure 5A:
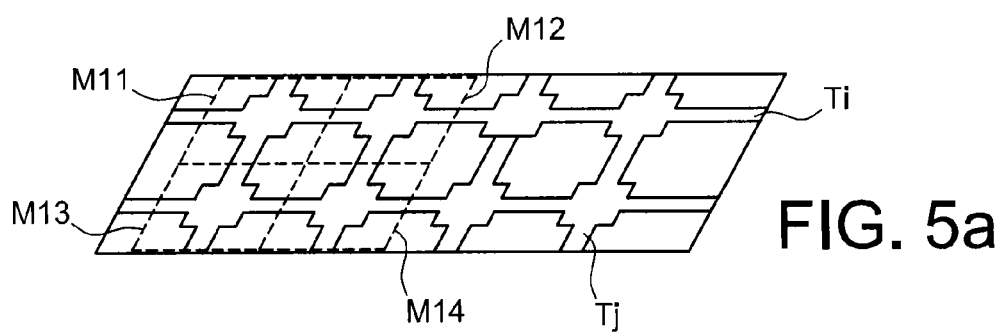
FIGS. 5a and 5b show possible embodiments of multi-pattern supports according to one possible embodiment of the invention.

As shown in FIG. 5a, the patterns M11, M12, M13, M14 may be contiguous. Thus, the support has a set of tracks Ti, Tj that extend from one pattern to the next continuously along the entire surface of the support (for example track Ti extending from pattern M11 to pattern M12, etc.)

Figure 5B:
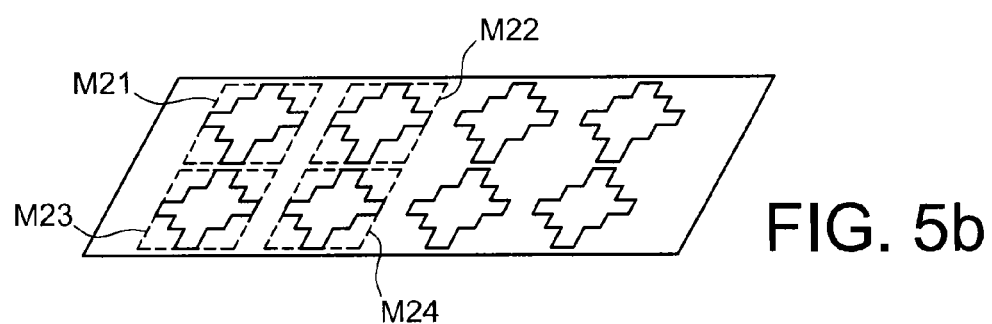

Alternatively, as shown in FIG. 5b, patterns M21, M22, M23, M24 may be unconnected. In such a case, tracks are interrupted and therefore there is no communication from one pattern to another.

The configuration in FIG. 5a with contiguous patterns and continuous lyophilic tracks has the advantage that it enables global wetting of the support instead of a drop by drop deposition of droplets. Global wetting is followed by capillary evacuation of excess liquid towards the outside through the lyophilic tracks.

Figure 6A:
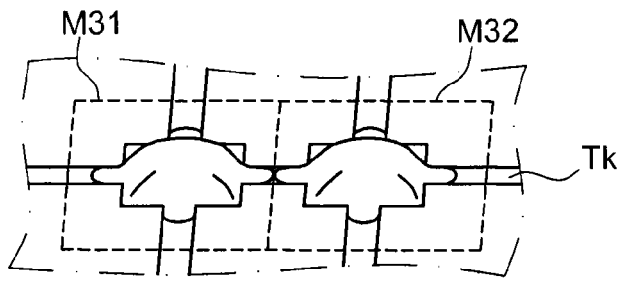
FIGS. 6a and 6b show configurations in which the droplets deposited on a multi-pattern support are separated and touch each other respectively.
Figure 6B:
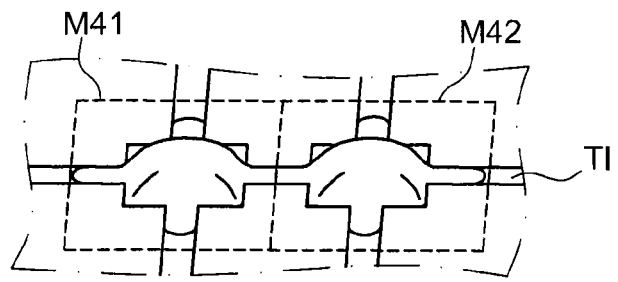

FIG. 6a shows a configuration of lyophilic the tracks such that the droplets deposited in the reception zones circumscribed in patterns M31 and M32 respectively remain separate from each other. On the other hand, FIG. 6b shows a configuration in which the droplets join together, creating continuity of the liquid on lyophilic zones (reception zones and tracks) of the support. The appropriate dimensions of lyophilic tracks to achieve such a communication of droplets can be calculated using the Surface Evolver software taking account of the following parameters: droplet volume, contact angle on lyophilic zones, surface tension, track length and width, plate mass.

The invention thus includes a method of capillary self-assembly for a plate on a support as described above, comprising steps to place at least one droplet in the reception zone of the support, and to place the plate on the droplet.

In particular, the support may have a plurality of reception zones, and droplets may be deposited drop by drop (avoiding contact between drops) or by global wetting. The result is advantageously collective deposition and collective self-assembly of a plurality of plates on the support.

The invention also includes a method for the formation of a support comprising a reception zone of which the external envelope corresponds to the shape of a plate to be placed on a droplet deposited in the reception zone so as to achieve capillary self-assembly of the plate and the support. The method comprises the formation of at least one pair of tracks extending on the support from the reception zone, the tracks having a lyophilic type affinity with the droplet such that an overflow of the droplet outside the reception zone is guided in the at least one pair of tracks, the at least one pair of tracks comprising a first track and a second track that do not have the same lyophilic type degree of affinity with the droplet.

Figure 7:
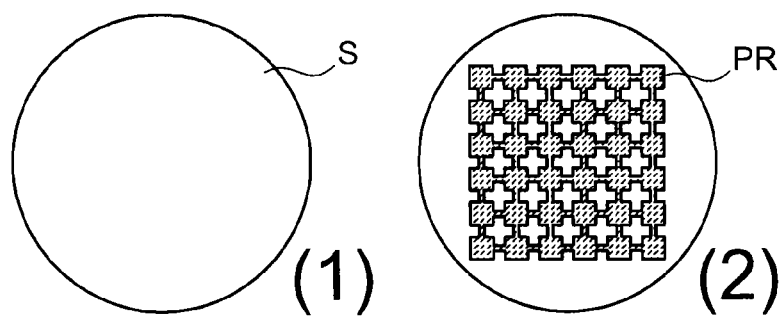
FIG. 7 diagrammatically shows various steps in a method of forming a support according to the invention.
Figure 7:
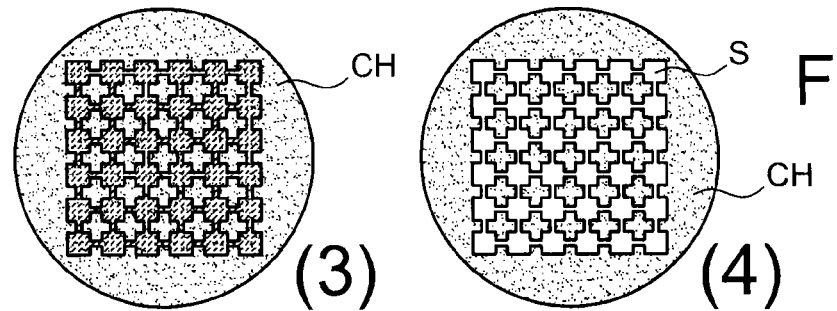

An example of such a method is given below. With reference to FIG. 7, there is a silicon substrate type support S with a diameter of 200 or 300 mm (1). A photoresist PR is applied on the substrate, and the photoresist is then exposed to light with appropriate masking so that the photoresist PR covers the portions of the support that will form the (assembly regions of the) reception zones and the hydrophilic track(s) (2). A hydrophobic layer CH is then formed on the substrate (3), for example by deposition (for example of a carbonaceous layer, an octafluorobutene layer C4F8 or a Teflon layer) or by surface treatment (for example a surface roughening treatment such as chemical etching). The photoresist PR is then removed (4) (for example using a solvent or by plasma treatment or by cleaning) so as to expose non-hydrophobic portions of the substrate S corresponding to (assembly zones of) reception zones and hydrophilic tracks, by the <<lift-off>> effect. Once the silicon has been exposed, a treatment can be applied to it designed to make it very hydrophilic (for example plasma, brushing, UV/ozone treatment), without altering the hydrophobic layer previously deposited on it. This can result in extremely hydrophilic zones (contact angle less than 5°, while this value is of the order of 40° if there is no treatment to accentuate the hydrophilic nature) surrounded by very hydrophobic zones (contact angle of more than 100°).

With this method, lyophilic tracks are formed at the same time as the (assembly regions of) reception zones. Therefore the formation of these lyophilic tracks does not introduce any additional complications during manufacturing.

The invention claimed is:

1. A support comprising a reception zone having an external envelope matching a shape of a plate designed to be placed on a droplet deposited at least in the reception zone in order to achieve capillary self-assembly of the plate and the support, and at least one pair of tracks that extend on the support from the reception zone and that have a lyophilic affinity with the droplet such that an overflow of the droplet beyond the reception zone is guided in the tracks, wherein the at least one pair of tracks comprises a first track and a second track that do not have a same lyophilic degree of affinity with the droplet.

2. The support according to claim 1, wherein the at least one pair of tracks and at least part of the reception zone have a lyophilic affinity with the droplet.

3. The support according to claim 1, wherein the first track and the second track extend on each side of the reception zone prolonging each other along a single direction.

4. The support according to claim 3, comprising at least two pairs of tracks extending in a plane of the support.

5. The support according to claim 4, comprising two pairs of tracks extending along approximately perpendicular directions in the support plane of the support.

6. The support according to claim 1, comprising a plurality of contiguous patterns, wherein each pattern is delimited by a periphery inside which the external envelope of a reception zone is circumscribed, the at least one pair of tracks extending from the reception zone as far as the periphery of the pattern.

7. The support according to claim 1, wherein the first and the second tracks do not have the same width.

8. The support according to claim 1, wherein the first and the second tracks are made from different materials.

9. The support according to claim 1, comprising an electro-capillary device associated with each track so that the lyophilic degree of affinity with the droplet can be modified.

10. A method for capillary self-assembly of a plate on a support according to claim 1, said method comprising:
    depositing at least one droplet in the support reception zone;
    placing the plate on the droplet.

11. The method according to claim 10, wherein the support has a plurality of patterns, wherein each pattern is delimited by a periphery inside which the external envelope of a reception zone is circumscribed, the at least one pair of tracks extending from the reception zone as far as the periphery of the pattern, and in which global wetting of the support is done to place a droplet in each reception zone.

12. The method according to claim 10, wherein the substrate support has a plurality of patterns, wherein each pattern is delimited by a periphery to inside which the external envelope of the reception zone is circumscribed, the at least one pair of tracks extending from the reception zone as far as the periphery of the pattern, and wherein a plurality of plates is collectively placed.

13. A method of forming a support comprising a reception zone having an external envelope matching a shape of a plate to be placed on a droplet deposited in the reception zone for capillary self-assembly of the plate and the support, said method comprising forming at least one pair of tracks extending on the support from the reception zone and having a lyophilic affinity with the droplet such that an overflow of the droplet outside the reception zone is guided in the tracks, the at least one pair of tracks comprising a first track and a second track that do not have the same lyophilic degree of affinity with the droplet.

14. The method according to claim 13, further comprising forming the first track and the second track such that they extend on each side of the reception zone prolonging each other, and wherein said first and second tracks are not subjected to a same surface treatment such that said first and second tracks have a different lyophilic degree of affinity with the droplet.

* * * * *